United States Patent
Chang et al.

(10) Patent No.: US 6,767,818 B1
(45) Date of Patent: Jul. 27, 2004

(54) METHOD FOR FORMING ELECTRICALLY CONDUCTIVE BUMPS AND DEVICES FORMED

(75) Inventors: Shyh-Ming Chang, Hsinchu (TW); Tai-Hong Chen, Hsinchu (TW); Yu-Te Hsieh, Tao Yuan (TW); Chun-Ming Huang, Taichung (TW); Jui Ming Ni, Chu-Pei (TW); Ching-Yun Chang, Taichung (TW); Jwo-Huei Jou, Hsin-Chu (TW)

(73) Assignee: Industrial Technology Research Institute, Hsin Chu (TW)

( * ) Notice: Subject to any disclaimer, the term of this patent is extended or adjusted under 35 U.S.C. 154(b) by 173 days.

(21) Appl. No.: 09/634,556

(22) Filed: Aug. 7, 2000

(51) Int. Cl.[7] .............................................. H01L 21/44
(52) U.S. Cl. ........................ 438/613; 438/614; 438/106
(58) Field of Search ................................ 438/613, 614, 438/615, 612, 106, 108; 228/180.22; 257/737, 773, 774, 775, 776, 777, 778, 779, 780, 786

(56) References Cited

U.S. PATENT DOCUMENTS

| | | |
|---|---|---|
| 5,393,697 A | 2/1995 | Chang et al. |
| 5,707,902 A | 1/1998 | Chang et al. |
| 5,925,930 A * | 7/1999 | Farnworth et al. .......... 257/737 |
| 6,189,208 B1 * | 2/2001 | Estes et al. ................. 174/260 |

OTHER PUBLICATIONS

Merriam Webster's Collegiate Dictionary, the 10th edition, 1999, pp 927.*

* cited by examiner

Primary Examiner—Thanh Nguyen
(74) Attorney, Agent, or Firm—Tung & Associates

(57) ABSTRACT

A method for forming electrically conductive bumps on a semiconductor substrate, or a semiconductor wafer and devices formed by the method are disclosed. In the method, a wafer that has an active surface, a plurality of conductive elements formed on the active surface and a passivation layer insulating the plurality of conductive bumps from each other is first provided. A first metal layer is then sputter deposited on top of the plurality of conductive elements and the passivation layer, followed by stencil printing a plurality of bumps of an insulating material on top of each one of the plurality of conductive elements. The plurality of bumps may be heat treated to a temperature of at least 100° C. for a period of at least 10 minutes for stress relief. A second metal layer is then sputter deposited on top of the plurality of bumps and the first metal layer. The first and the second metal layers are then patterned by a photolithographic process and formed by a wet or dry etching process to remove metal layers in areas in-between the plurality of bumps.

16 Claims, 3 Drawing Sheets

(A)

(B)

(C)

(D)

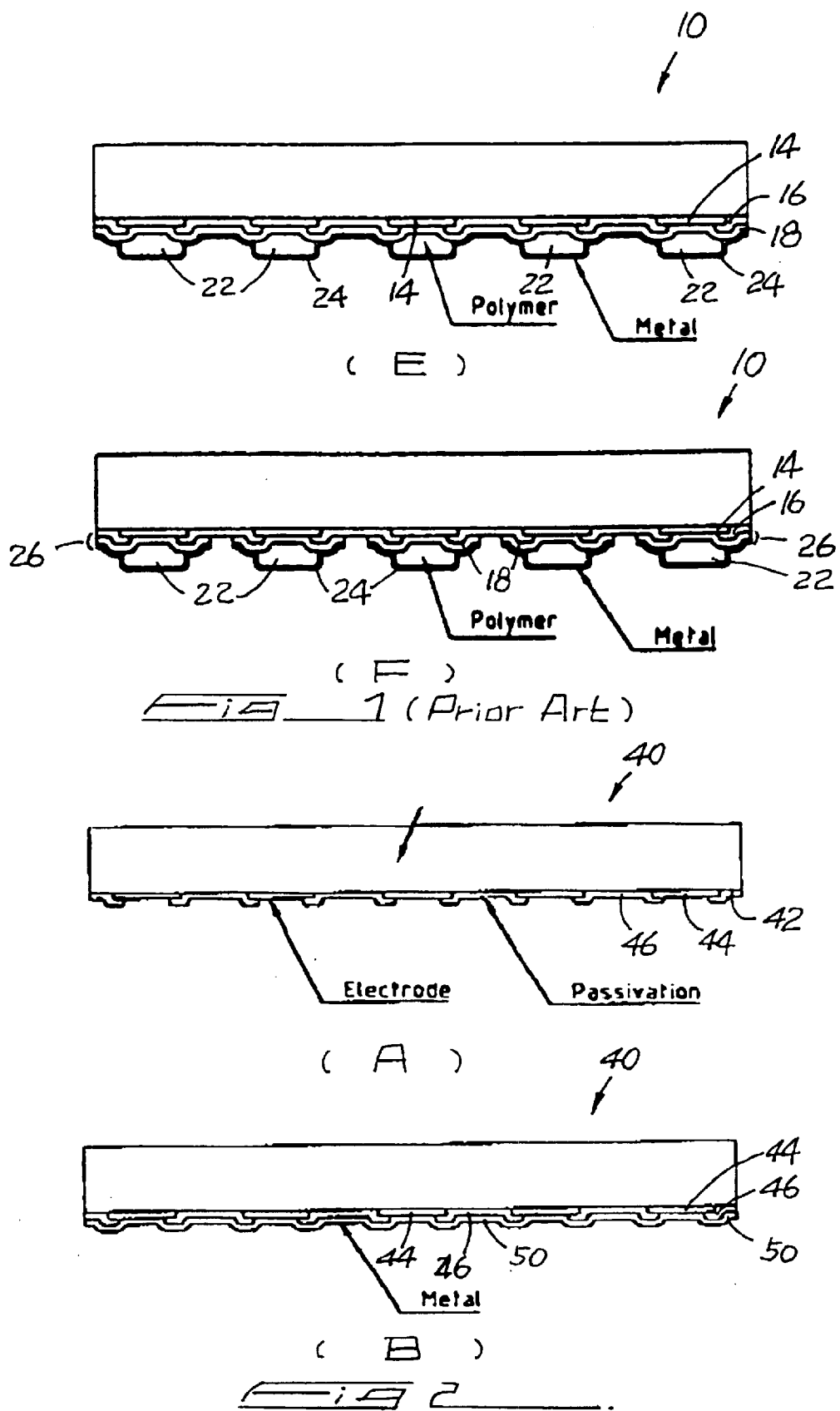

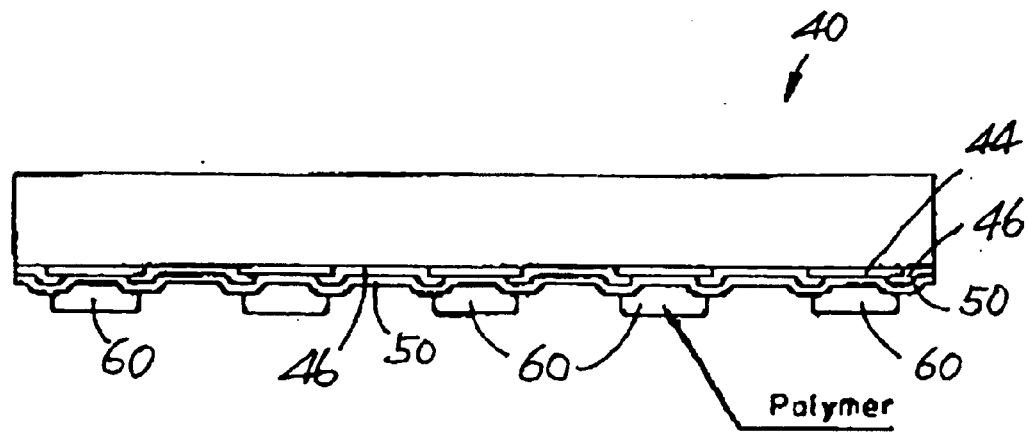
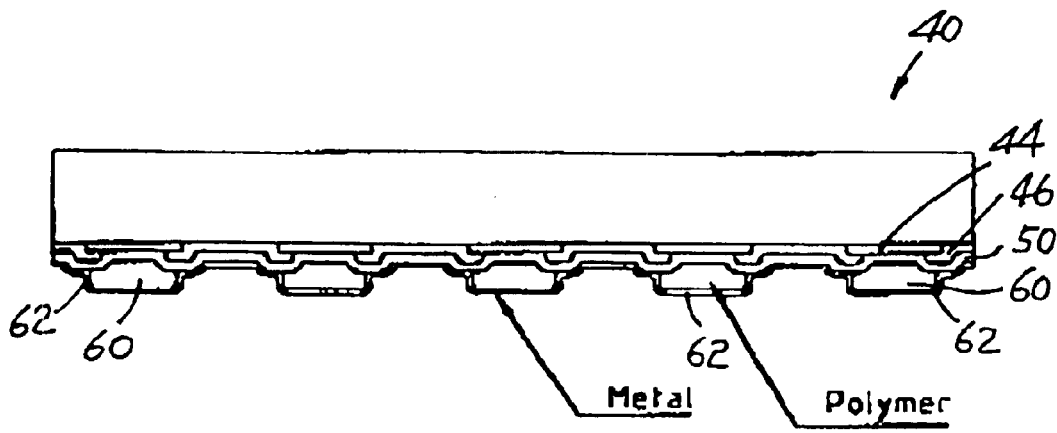
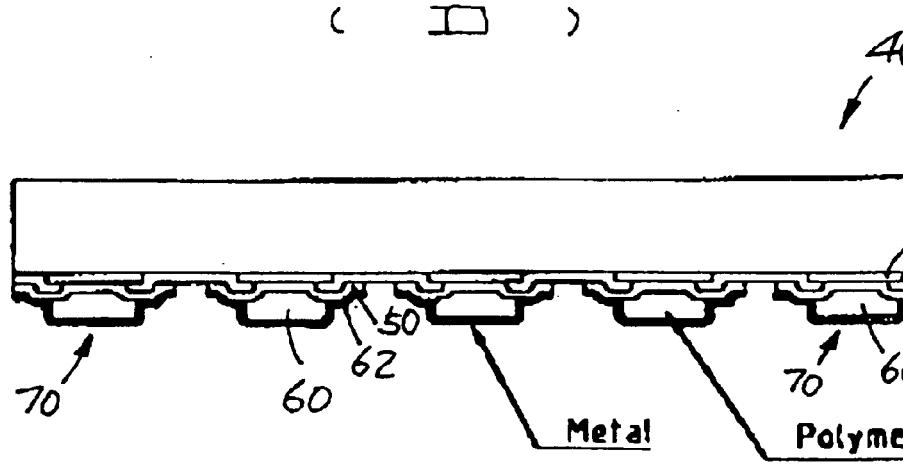
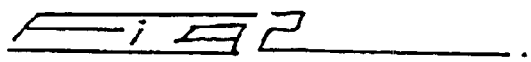

METHOD FOR FORMING ELECTRICALLY CONDUCTIVE BUMPS AND DEVICES FORMED

FIELD OF THE INVENTION

The present invention generally relates to a method for forming electrically conductive bumps and devices formed and more particularly, relates to a single-stencil and single-mask process for forming electrically conductive, compliant bumps on a wafer and devices formed by the method.

BACKGROUND OF THE INVENTION

In the fabrication of modern semiconductor devices, the ever increasing device density and decreasing device dimensions a demand more stringent requirements in the packaging or interconnecting techniques in such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become more difficult.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique.

Similarly, the thin film electrodeposition technique which also requires a ball limiting metallurgy layer to be deposited and defined by an etching process which has the same limitations as the C4 technique.

In recent years, chip scale packages (CSP) have been developed as a new low cost packaging technique for high volume production of IC chips. One of such chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

A unique feature of the chip scale package is the use of an interposer layer that is formed of a flexible, compliant material. The interposer layer provides the capability of absorbing mechanical stresses during the package forming steps and furthermore, allows thermal expansion mismatch between the die and the substrate. The interposer layer, therefore, acts both as a stress buffer and as a thermal expansion buffer. Another unique feature of the chip scale package, i.e. such as a micro-BGA package, is its ability to be assembled to a circuit board by using conventional surface mount technology (SMT) processes.

In a typical micro-BGA package, a flexible interposer layer (which may contain circuit) is used to interconnect bond pads on an IC chip to an array of solder bump connections located on a flexible circuit. The flexible circuit, normally of a thickness of approximately 25 $\mu$m, is formed of a polymeric material such as polyimide which is laminated to a silicon elastomer layer of approximately 150 $\mu$m thick. The silicon elastomeric layer provides flexibility and compliance in all three directions for relief of stresses and thermal expansion mismatches. To further reduce the fabrication cost of IC devices, it is desirable that if a whole wafer can be passivated to seal the IC dies on the wafer, and then be severed into individual IC dies from the wafer such that not only the benefits of a chip scale package can be realized, the packaging cost for the IC dies may further be reduced.

To achieve the same stress-buffing effect of the interposer layer used in the micro-BGA packages, others have developed similar stress-buffing layers as part of a bump structure in so-called compliant bumps. For instance, in U.S. Pat. Nos. 5,707,902 and 5,393,697, assigned to the common assignee of the present invention and are incorporated herein by reference, methods have been disclosed for fabricating a composite bump structure that includes a polymeric body of relatively low Young's modulus (compared to metals) covered by a conductive metal coating at the input/output pads of an IC (integrated circuit) element or substrate. The composite bump is formed by processing steps of material deposition, photolithography and dry or wet etching techniques. The composite bump can be formed directly on the input/output pad or on a base metal pad which is formed to cover the input/output pad for improved flexibility in locating the composite bump.

A conventional method for forming the composite bump is shown in FIGS. 1A–1F. In the method, a semiconductor wafer 10 is first provided. On an active surface 12 of the semiconductor substrate 10, is then formed a plurality of conductive elements 14 which may be input/output pads for the IC circuits formed on the semiconductor substrate 10. The plurality of conductive elements 14 is insulated by a passivation layer 16 formed of an insulating material. The passivation layer 16 is first blanket deposited on the active surface 12 of the semiconductor substrate 10, and then formed photolithographically to expose the plurality of conductive elements 14, as shown in FIG. 1A.

In the next step of the process, as shown in FIG. 1B, a first electrically conductive material 18, such as a conductive metal, is blanket deposited on top of the semiconductor substrate 10 overlying the passivation layer 16 and the multiplicity of conductive elements 14. A suitable metallic material for layer 18 may be aluminum or nickel for providing electrical communication with the plurality of conductive elements 14. An insulating material layer 20, possibly of a polymeric-based material, is then coated on the semiconductor substrate 10 encapsulating the first metal layer 18. The insulating material layer 20 can be advantageously applied onto the semiconductor substrate 10 by a method such as spin coating. When a solvent-containing polymeric material is used for layer 20, a curing cycle is necessary after the coating process to drive off the residual solvent in the polymeric paste material. It is further preferred that the polymeric material used in layer 20 to be desirably a photosensitive material such that it may be imaged and developed, thus negating the further need for a photoresist layer to be coated on top of the polymeric material layer.

After a photolithographic process is conducted on the polymeric material layer 20, the layer is dry or wet etched forming a plurality of electrically insulating bumps 22 on top of the first metal layer 18. It should be noted that during the photolithographic process, one of such electrically insulating bump 22 is formed on each of the corresponding one of the plurality of conductive elements 14. The etching process only defines the electrically insulating bumps 22 without removing the first metal layer 18. This is shown in FIG. 1D.

After the electrically insulating bumps 22 are cured at a desirable annealing temperature, as shown in FIG. 1E, a second electrically conductive layer, i.e. a second metal layer 24; is sputter deposited on top of the semiconductor substrate 10 overlying the electrically insulating bumps 22 and the first metal layer 18. The second metal layer 24, can be suitably sputtered of aluminum or nickel, or of any other high electrical conductivity metal to establish electrical communication with the first metal layer 18 and the plurality of conductive elements 14.

In the final step of the process, as shown in FIG. IF, a second photolithographic process is conducted to define the electrically conductive pads 26 formed of the first metal layer 18 and the second metal layer 24. The electrically conductive metal pads 26 are defined such that each polymeric bump 22 with its second metal layer 24 on top only communicates electrically with one conductive element 14. It should be noted that the electrically conductive pads 26 are formed by the first metal layer 18 and by the second metal layer 24 stacked together except the portion that is directly over the conductive element 14 being cushioned by the polymeric bump 22. A desirable stress-buffing effect is therefore achieved by the polymeric bumps 22 while providing electrical communication with each of the conductive elements 14 through the electrically conductive pads 26 that encapsulates the polymeric bumps 22.

The process described above for preparing electrically conductive bumps based on polymeric bumps coated with a metallic coating provides the desirable stress-buffing properties. However, the process requires at least two separate steps of photolithography, each including the steps of imaging, developing and etching, is therefore process intensive and labor intensive. Furthermore, the coating process, i.e. the spin coating process, used for applying the polymeric material layer for forming the bumps wastes a large quantity of the polymeric material applied. Since the polymeric material utilized are normally of a low dielectric constant type, and thus of relatively high cost, such as polyimide, the total cost of the fabrication process for the composite bumps is further increased. While higher density bumps can be formed by the conventional method, i.e. at a minimum pitch of about 10 μm, the advantage is comprised by the higher material costs, and the two photolithographic processes required.

It is therefore an object of the present invention to provide a method for forming electrically conductive bumps on a semiconductor substrate that does not have the drawbacks or shortcomings of the conventional method.

It is another object of the present invention to provide a method for forming electrically conductive bumps on a semiconductor substrate that can be carried out with only one photolithographic process.

It is a further object of the present invention to provide a method for forming electrically conductive bumps on a semiconductor substrate that are stress-buffered.

It is another further object of the present invention to provide a method for forming electrically conductive bumps on a semiconductor substrate wherein the bumps are formed of an electrically insulating material covered by a conductive coating.

It is still another object of the present invention to provide a method for forming electrically conductive bumps on a semiconductor substrate by first stencil printing bumps of an electrically insulating material and then coating the bumps with a sputtered metal layer.

It is yet another object of the present invention to provide a method for forming electrically conductive bumps on a semiconductor substrate by first stencil printing a plurality of bumps of a solvent-containing polymeric paste and then sputter depositing a metal layer on top of the bumps.

It is still another further object of the present invention to provide a semiconductor wafer that has a plurality of electrically conductive bumps formed on an active surface that includes a plurality of electrically conductive pads each formed on a corresponding one of a plurality of polymeric based bumps.

SUMMARY OF THE INVENTION

In accordance with the present invention, a method for forming electrically conductive bumps on a semiconductor substrate and devices formed by the method are disclosed.

In a preferred embodiment, a method for forming electrically conductive bumps on a wafer can be carried out by the operating steps of first providing a wafer that has an active surface, a plurality of conductive elements formed on the active surface, and a passivation layer insulating the plurality of conductive elements from each other; sputter depositing a first metal layer on top of the plurality of conductive elements and the passivation layer; printing a plurality of bumps of an insulating material each on top of one of the plurality of conductive elements; heat treating the plurality of bumps at a temperature of at least 100° C.; sputter depositing a second metal layer on top of the plurality of bumps and the first metal layer; and patterning and removing the first and the second metal layer in areas in-between the plurality of bumps.

The method for forming electrically conductive bumps on a wafer may further include the step of forming the plurality of conductive elements spaced-apart by at least 100 μm, or the step of forming the plurality of conductive elements in aluminum or copper. The method may further include the step of forming the passivation layer in an insulating material, or the step of sputter depositing the first metal layer in Al, Ni, Ti, W, Cu, Cr and alloys thereof, or the step of sputter depositing the first metal layer to a thickness not higher than 50 μm. The method may further include the step of printing the plurality of bumps by a stencil printing technique, printing the plurality of bumps in a polymeric material, or in a polyimide. The method may further include the step of printing the plurality of bumps to a width between about 50 $\mu$m and about 100 $\mu$m, or to a thickness of at least 20 $\mu$m. The method may further include the step of printing the plurality of bumps in a polymeric-based paste, or in a solvent-containing polymeric paste. The method may further include the step of depositing the second metal layer in Al, Ni, Ti, W, Pt, Pd, Cu, Cr, Ag, Au, In, Sn, Pb or alloys thereof, or the step of patterning the first and the second metal layer by a photolithographic method, or the step of removing the first and the second metal layer by a wet etching technique.

The present invention is further directed to a semiconductor wafer that has a plurality of electrically conductive bumps formed on an active surface which includes a semiconductor wafer that has an active surface on top; a plurality of conductive elements formed on the active surface spaced-apart by at least 50 $\mu$m; a passivation layer insulating the plurality of conductive elements from each other; a plurality of a first electrically conductive pad each on one of the plurality of conductive elements; a plurality of electrically insulative bump each on one of the plurality of a first electrically conductive pad; and a plurality of a second electrically conductive pad each on top of one of the plurality of electrically insulative bump in electrical communication with a corresponding one of the plurality of a first electrically conductive pad and one of the plurality of conductive elements.

In the semiconductive wafer that has a plurality of electrically conductive bumps formed on an active surface, the plurality of a first electrically conductive pad and the plurality of a second electrically conductive pad are formed of the same or different electrically conductive metal, or formed of Al, Ni, Ti, W, Pt, Pd, Cu, Cr, Ag, Au, In, Sn, Pb or alloys thereof. The plurality of electrically insulative bump is formed of a polymeric material, or of polyimide. The plurality of electrically insulative bump may further be formed of a solvent-containing polymeric paste to a width between about 50 $\mu$m and about 100 $\mu$m, and to a thickness of at least 20 $\mu$m.

BRIEF DESCRIPTION OF THE DRAWINGS

These objects, features and advantages of the present invention will become apparent from a close examination of the following specification and the appended drawings in which:

FIG. 2A is an enlarged, cross-sectional view of the present invention semiconductor substrate that has a plurality of conductive elements and a passivation layer formed on top.

FIG. 2B is an enlarged, cross-sectional view of the semiconductor substrate of FIG. 2A with a first metal layer deposited on top of the plurality of conductive elements and the passivation layer.

FIG. 2C is an enlarged, cross-sectional view of the present invention semiconductor substrate of FIG. 2B with a plurality of electrically insulating bumps stencil-printed on top.

FIG. 2D is an enlarged, cross-sectional view of the semiconductor substrate of FIG. 2C with a second metal layer sputter deposited on top.

FIG. 2E is an enlarged, cross-sectional view of the present invention semiconductor substrate of FIG. 2D with the first and the second metal layer photolithographically formed into individual electrically conductive pads.

DETAILED DESCRIPTION OF THE PREFERRED EMBODIMENT

Figure 1:
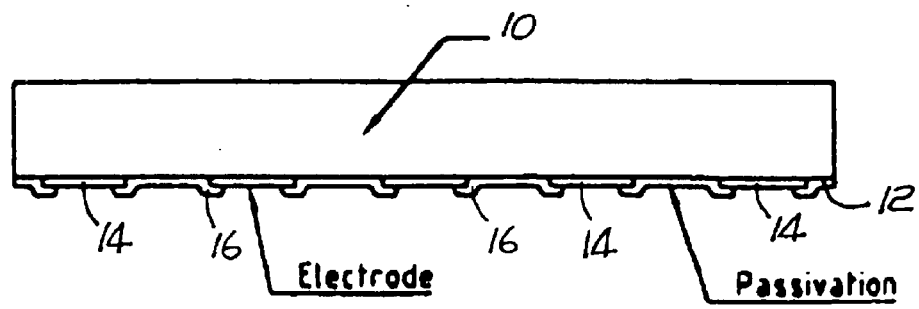
FIG. 1A is an enlarged, cross-sectional view of a conventional semiconductor substrate that has a plurality of conductive elements and a passivation layer built on top.
FIG. 1B is an enlarged, cross-sectional view of the semiconductor substrate of FIG. 1A with a first metal layer deposited on top.
FIG. 1C is an enlarged, cross-sectional view of the semiconductor substrate of FIG. 1B with an insulating material layer spin-coated on top.
FIG. 1D is an enlarged, cross-sectional view of the semiconductor substrate of FIG. 1C with the insulating material layer formed into bumps by a photolithographic method.
FIG. 1E is an enlarged, cross-sectional view of the semiconductor substrate of FIG. 1D with a second metal layer deposited on top.
FIG. 1F is an enlarged, cross-sectional view of the semiconductor substrate of FIG. 1E with the first and the second metal layer photolithographically formed for providing electrical contact to each conductive element.
Figure 1:
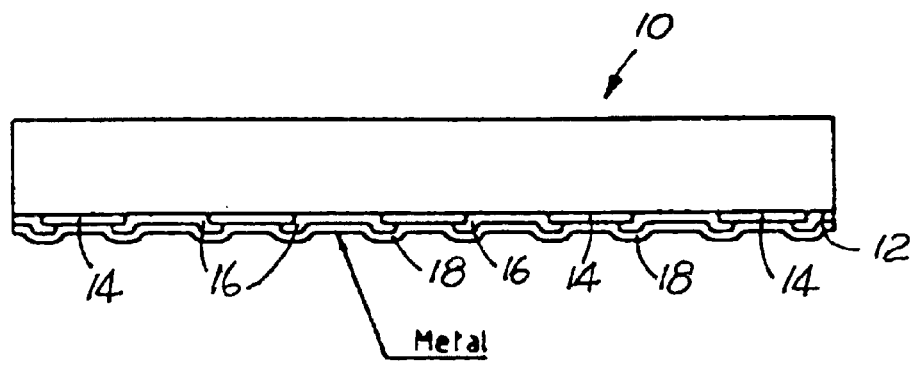
Figure 1:
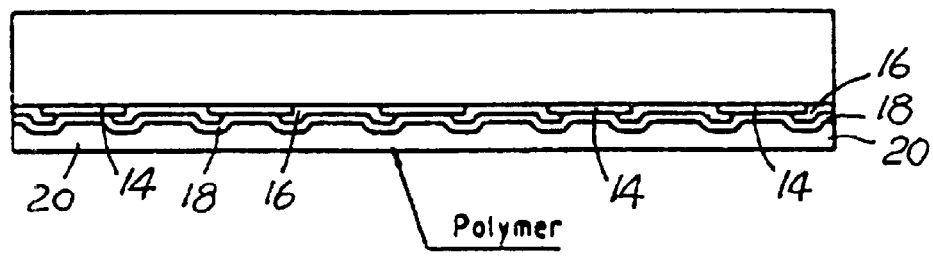
Figure 1:
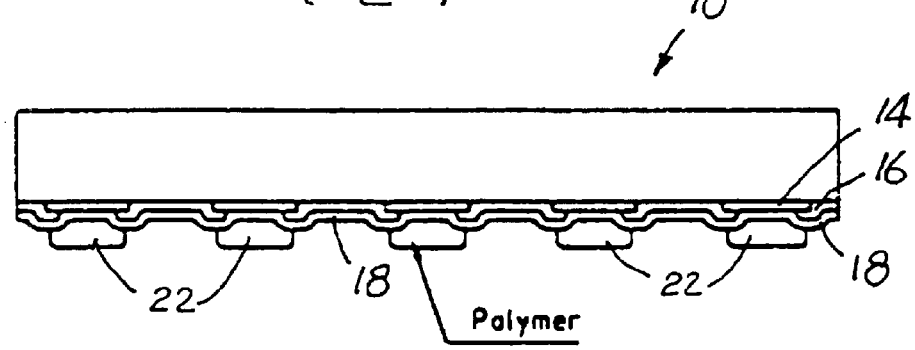

The present invention discloses a method for forming electrically conductive bumps on a semiconductor substrate, such as a semiconductor wafer and devices formed by such method.

In the method, a semiconductor wafer that has an active surface, a plurality of conductive elements such as input/output pads formed on the active surface, and a passivation layer insulating the plurality of conductive elements from each other is first provided. The plurality of conductive elements can be suitably formed of aluminum or copper, or of any other metal that has high electrical conductivity. A first metal layer is then deposited by evaporation or sputter deposition on top of the plurality of conductive elements and the passivation layer to form electrical communication with the conductive elements. A plurality of bumps are then formed of an insulating material each on top of one of the plurality of conductive elements. The plurality of bumps can be advantageously formed by a stencil printing method of a polymeric-based material, or a solvent-containing polymeric paste. The plurality of bumps is then heat treated in an annealing process at a temperature of at least 100° C., and preferably at a temperature of at least 150° C.

A second metal layer is then sputter deposited on top of the plurality of bumps formed of the polymeric material and the first metal layer. The first and the second metal layer are then patterned in a photolithographic process followed by an etching process to remove the metal layers in areas in-between the plurality of bumps, thus leaving only electrically conductive bumps on top of the conductive elements.

The present invention is further directed to a semiconductor wafer that has a plurality of electrically conductive bumps formed on an active surface which includes a semiconductor wafer that has an active surface on top, a plurality of conductive elements formed on the active surface spaced-apart by at least 100 $\mu$m, a passivation layer insulating the plurality of conductive elements from each other, a plurality of a first electrically conductive pads each on one of the plurality of conductive elements, a plurality of electrically insulative bump each on one of the plurality of a first electrically conductive pads, and a plurality of a second electrically conductive pads each on top of one of the plurality of electrically insulative bump in electrical communication with a corresponding one of the plurality of a first electrically conductive pads and the plurality of conductive elements.

Referring now to FIG. 2A, wherein an enlarged, cross-sectional view of a present invention semiconductor substrate 90 is shown. The semiconductor substrate 40 has, on its active surface 42, a plurality of conductive elements 44 formed which are insulated by a passivation layer 46. The passivation layer 46 may be first blanket deposited and then openings are formed over the conductive elements 44 to expose the conductive elements by a standard photolithographic method. The conductive elements 44 may be input/output pads formed on the active surface 42 of the semiconductor substrate 40. The conductive elements 44 may be further formed of either aluminum or copper, or of any other metal of high electrical conductivity. The passivation layer 46 may be formed of an insulating material such as a spin-on-glass or of any other suitable dielectric material.

A first electrically conductive material layer 50 such as a metal layer formed of Al, Ni, Ti, W, Cu, Cr or alloys thereof is then deposited on top of the semiconductor substrate 40 overlying the plurality of conductive elements 44, thus establishing electrical communication therewith overlying the passivation layer 46. The first metallic material layer 50 may be suitably deposited by a technique such as sputter deposition or evaporation. This is shown in FIG. 2B.

The present invention novel semiconductor substrate 40 is then stencil printed a plurality of insulating bumps 60 each on top of a corresponding conductive element 44 for stress-buffing and for use as a base for metal conductive pad formation. It should be noted that the plurality of electrically insulating bumps 60 can be printed of a polymeric-based material, or of a solvent-containing polymeric paste by a low cost printing method. The disadvantage of the printing method is that the pitch distance between the bumps 60 is limited to a minimum of about 100 $\mu$m. This is compared to a smaller pitch distance of about 10 $\mu$m achievable by the thin film method of photolithography. The present invention thick film printing technique is therefore suitable in forming bumps that have large spacing between them. The polymeric-based bumps 60 serve the stress-buffing function for the electrically conductive layer formed thereon.

A suitable polymeric material used is polyimide, such as polyimide produced by OCG Microelectronic Materials, Inc. of Tempe, Ariz. under the trade name of Probimide™. Several grades of Probimide™ are suitable for use in the present invention stencil printing process, for instance, grade 7010 and grade 514. The viscosity of the polyimide paste can be suitably controlled by its solvent content such that the stencil printing process can be easily carried out. The present invention semiconductor substrate 40 that has a plurality of insulating bumps 60 formed on top is shown in FIG. 2C. Suitable dimensions of the polymeric bumps are between about 50 $\mu$m and about 100 $\mu$m in width (or in diameter) and a thickness of at least 20 $\mu$m. The first metal layer 50 may be suitably sputter deposited, or evaporated, onto the semiconductor substrate to a thickness of not larger than 20 $\mu$m, and preferably not larger than 10 $\mu$m.

The polymeric bumps 60 are frequently heat treated to stabilize its dimensions and to relive stresses during formation. A suitable heat treating process can be conducted at a temperature higher than 100° C., and more preferably higher than 150° C. for a time period of at least 10 minutes, and more preferably for a time period of at least 30 minutes. The heat treating, or annealing, process on the polymeric bumps 60 should be conducted before the deposition of the second metal layer.

On top of the plurality of polymeric bumps 60 is then deposited a second metal layer 62 which overlies the plurality of polymeric bumps 60 and the first metal layer 50. The second metal layer 62 establishes electrical communication with the first metal layer 50, as shown in FIG. 2D. The deposition process for the second metal layer 62 can be advantageously carried out by a sputtering technique, or by an evaporation technique. Generally, the sputtering technique is more preferred since it can be carried out at a faster speed. The second metal layer 62 can be formed of an electrically conductive metal such as aluminum or nickel. The second metal layer 62 functions as the contact layer with conductive elements on a second substrate such as a printed circuit board (not shown).

In the final step of the process, as shown in FIG. 2E, a standard photolithographic method and an etching step are used to pattern the second metal layer 62 and to etch away the second metal layer 62 and the first metal layer 50 in areas between the polymeric bumps 60. Individual electrically conductive pad 64 formed by the dual-layers of the second metal layer 62 and the first metal layer 50 is thus formed for each conductive element 44. It should be noted that the present invention novel stress 12 buffered, compliant, and electrically conductive bump 70 is thus formed by the electrically conductive pad 64 and the polymeric bump 60 on top of each conductive element 44 formed on the surface of the semiconductor substrate 40. Since the polymeric material utilized for the bump 60 are of a low Young's modulus nature, the electrically conductive, compliant bump 70 provides greatly improved stress-buffing characteristics during subsequent bonding operation with a printed circuit board, or with any other electronic component.

The present invention novel method for forming electrically conductive bumps on a semiconductor substrate can therefore be carried out by utilizing a single photolithographic process for defining the electrically conductive bumps, and by a single-stencil printing process for forming the electrically insulative polymeric-based bumps. When compared to a conventional process in which two photolithographic processes are required and the polymeric material layer is formed by spin coating, the present invention novel method presents several major processing advantages. First, a smaller volume of the polymeric material, which is normally of high cost, is needed per substrate or per wafer. This is because stencil printing is used to form the plurality of polymeric bumps which normally result in less than 1% loss of the polymeric material. Moreover, the printing process can be conducted by utilizing a larger variety of paste materials when compared to the limited number of materials that can be used in photolithographic method. The present invention thick film processing method is therefore superior when compared to the thin film process of the conventional method. The only limitation of the present invention method is that the minimum pitch can be formed between the electrically conductive bumps is about 100 $\mu$m and thus the method is more suitable to semiconductor substrates that have large spacings between bumps.

The present invention method for forming electrically conductive bumps on a semiconductor substrate and devices formed by the method have therefore been amply described in the above descriptions and in the appended drawings of FIGS. 2A–2E.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming electrically conductive bumps on a wafer comprising the steps of:

providing a wafer having an active surface, a plurality of conductive elements formed on the active surface, and a passivation layer insulating said plurality of conductive elements from each other, sputter depositing a first metal layer on top or said plurality of conductive elements and said passivation layer, printing a plurality of bumps of an insulating material each on top of one of said plurality of conductive elements, heat treating said plurality of bumps at a temperature of at least 100° C., sputter depositing a second metal layer on top of said plurality of bumps and said first metal layer, and patterning and removing said first and said second metal layer in areas in-between said plurality of bumps.

2. A method for forming electrically conductive bumps on a wafer according to claim 1 further comprising the step of forming said plurality of conductive elements spaced-apart by at least 100 µm.

3. A method for forming electrically conductive bumps on a wafer according to claim 1 further comprising the step of forming said plurality of conductive elements in aluminum or copper.

4. A method for forming electrically conductive bumps on a wafer according to claim 1 further comprising the step of forming said passivation layer in an insulating material.

5. A method for forming electrically conductive bumps on a wafer according to claim 1 further comprising the step of sputter depositing said first metal layer in a material selected from the group consisting of Al, Ni, Ti, W, Cu, Cr and alloys thereof.

6. A method for forming electrically conductive bumps on a water according to claim 1 further comprising the step of sputter depositing said first metal layer to a thickness not higher than 50 µm.

7. A method for forming electrically conductive bumps on a wafer according to claim 1 further comprising the step of printing said plurality of bumps by a stencil printing technique.

8. A method for forming electrically conductive bumps on a wafer according to claim 1 further comprising the step of printing said plurality of bumps by a stencil printing technique in a polymeric material.

9. A method for forming electrically conductive bumps on a wafer according to claim 1 further comprising the step of printing said plurality of bumps by a stencil printing technique in polyimide.

10. A method for forming electrically conductive bumps on a wafer according to claim 1 further comprising the step of printing said plurality of bumps by a stencil printing technique to a width of at least 50 µm.

11. A method for forming electrically conductive bumps on a wafer according to claim 1 further comprising the step of printing said plurality of bumps by a stencil printing technique to a thickness of at least 20 µm.

12. A method for forming electrically conductive bumps on a wafer according to claim 1 further comprising the step of printing said plurality of bumps by a stencil printing technique in a polymeric-based paste.

13. A method for forming electrically conductive bumps on a wafer according to claim 1 further comprising the step of printing said plurality of bumps by a stencil printing technique in a solvent-containing polymeric paste.

14. A method for forming electrically conductive bumps on a wafer according to claim 1 further comprising the step of depositing said second metal layer in a material selected from the group consisting of Al, Xi, Ti, W, Pt, Pd, Cu, Cr, Ag, Au, In, Sn, Pb and alloys thereof.

15. A method for forming electrically conductive bumps on a wafer according to claim 1 further comprising the step of patterning said first and said second metal layer by a photolithographic method.

16. A method for forming electrically conductive bumps on a water according to claim 1 further comprising the step of removing said first and said second metal layers by a photolithographic and a wet etch method.

* * * * *